US010935595B1

(12) United States Patent
Vimjam et al.

(10) Patent No.: US 10,935,595 B1
(45) Date of Patent: Mar. 2, 2021

(54) METHODS FOR IDENTIFYING INTEGRATED CIRCUIT FAILURES CAUSED BY ASYNCHRONOUS CLOCK-DOMAIN CROSSINGS IN THE PRESENCE OF MULTIPLE MODES

(71) Applicants: REAL INTENT, INC., Sunnyvale, CA (US); Vishnu Vimjam, Sunnyvale, CA (US)

(72) Inventors: Vishnu Vimjam, San Jose, CA (US); Vikas Sachdeva, Bengaluru (IN); Prakash Narain, San Carlos, CA (US); Paul Vyedin, San Jose, CA (US)

(73) Assignee: Real Intent, Inc., Sunnyvale, CA (US)

( * ) Notice: Subject to any disclaimer, the term of this patent is extended or adjusted under 35 U.S.C. 154(b) by 45 days.

(21) Appl. No.: 16/280,759

(22) Filed: Feb. 20, 2019

Related U.S. Application Data

(60) Provisional application No. 62/667,371, filed on May 4, 2018.

(51) Int. Cl.
*G01R 31/28* (2006.01)
*G01R 31/317* (2006.01)
*G06F 11/07* (2006.01)

(52) U.S. Cl.
CPC ....... *G01R 31/2846* (2013.01); *G01R 31/317* (2013.01); *G06F 11/07* (2013.01)

(58) Field of Classification Search
None
See application file for complete search history.

(56) References Cited

U.S. PATENT DOCUMENTS

| | | | | |
|---|---|---|---|---|
| 8,438,517 | B2* | 5/2013 | Appleton | G06F 30/327 716/113 |
| 9,223,916 | B2* | 12/2015 | DiLullo | G06F 30/3312 |
| 2005/0097484 | A1* | 5/2005 | Sarwary | G06F 1/12 716/108 |
| 2006/0190858 | A1* | 8/2006 | Chu | G06F 30/33 716/103 |
| 2007/0283205 | A1* | 12/2007 | Chelstrom | G01R 31/318594 714/727 |

(Continued)

*Primary Examiner* — Jermele M Hollington
(74) *Attorney, Agent, or Firm* — Pranav Ashar

(57) ABSTRACT

Methods and systems are described to identify potential failures caused by metastability arising from signal propagation between asynchronous clock domains in integrated circuits with multiple operating modes, each mode allowing selected clocks to propagate. Typical integrated circuits have numerous operating modes, and hence numerous possible clock combinations, each combination causing different asynchronous clock-domain crossings, and hence different potential failures. Since verification for even one clock combination is time-consuming, explicitly enumerating and verifying all possible clock combinations is unviable. In practice very few clock combinations are verified, possibly missing failures. The present invention achieves superior performance, scalability, comprehensiveness and precision in verification despite numerous operating modes, due the following insights: (a) The number of possible clock combinations for a transmit-receive signal pair is small relative to the total number of operating modes, and (b) Cause of failure for a transmit-receive pair remain identical across many clock combinations associated with it.

12 Claims, 13 Drawing Sheets

A Representative Asynchronous Clock-Domain Crossing

(56) References Cited

U.S. PATENT DOCUMENTS

| | | | | |
|---|---|---|---|---|
| 2009/0125771 | A1* | 5/2009 | Duggal | G01R 31/318594 714/731 |
| 2011/0204932 | A1* | 8/2011 | Cortadella | G06F 7/00 327/145 |
| 2011/0296265 | A1* | 12/2011 | Rakheja | G01R 31/318558 714/731 |
| 2014/0101505 | A1* | 4/2014 | Tekumalla | G01R 31/318552 714/729 |
| 2015/0161312 | A1* | 6/2015 | Drasny | G06F 30/30 716/108 |
| 2016/0259879 | A1* | 9/2016 | Ganai | G06F 30/398 |

* cited by examiner

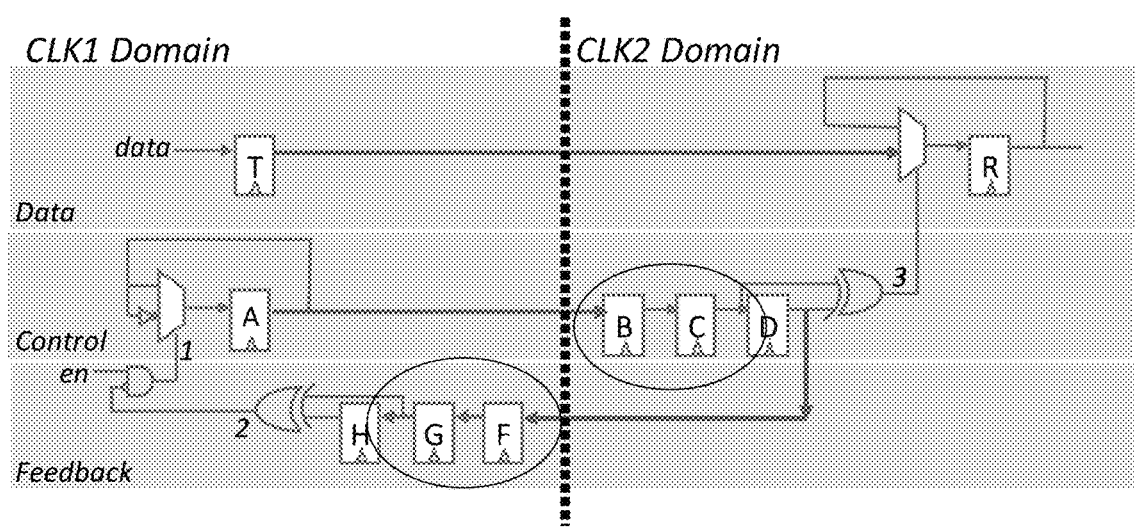
Fig. 1 A Representative Asynchronous Clock-Domain Crossing

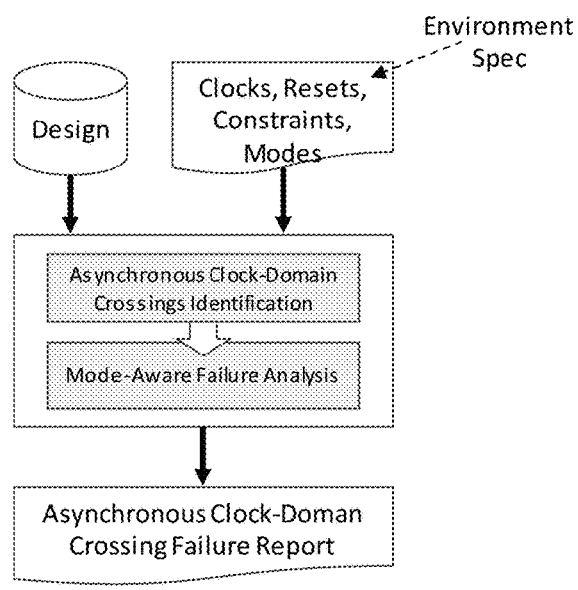
Fig. 2 Input-Output Flow for Operating-Mode-Aware Asynchronous CDC Analysis

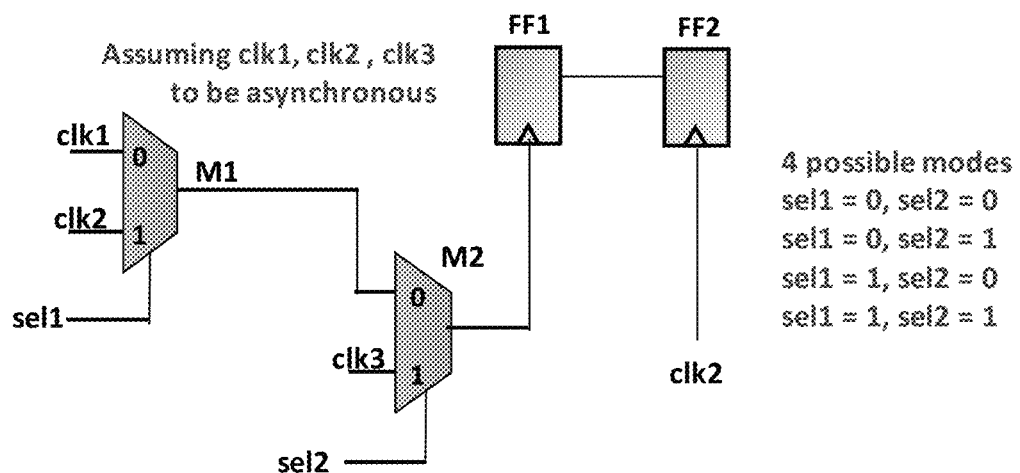
Fig. 3 Example of How Modes Cause or Prevent Asynchronous Clock-Domain Crossings

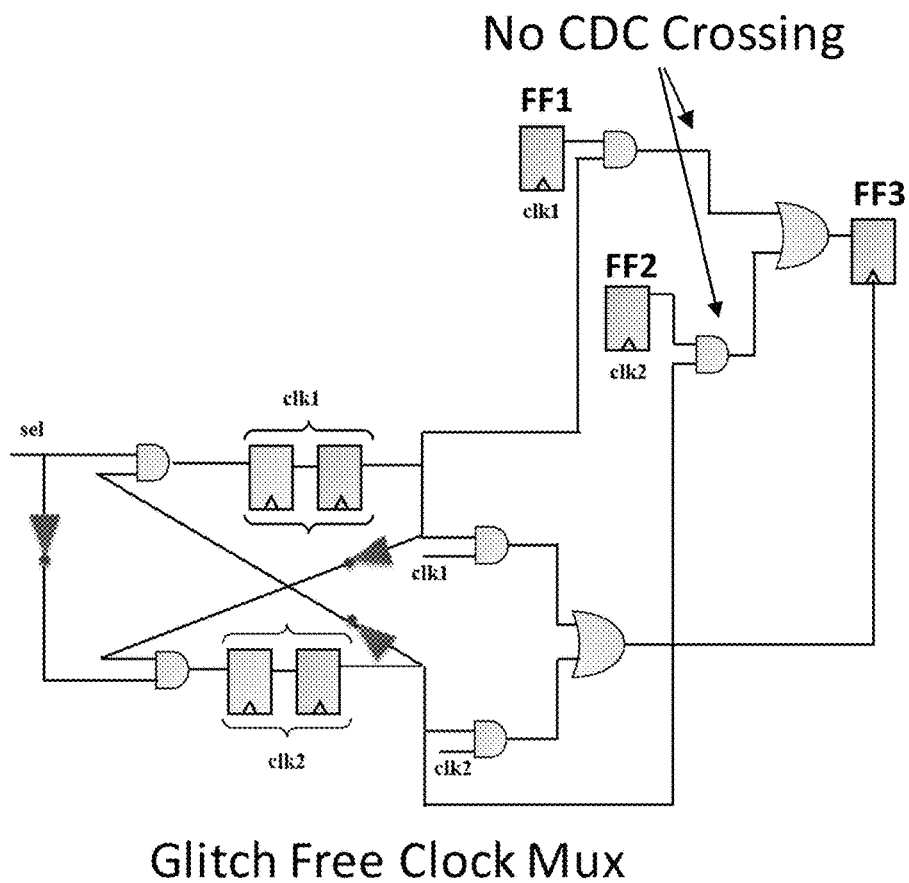
Fig. 4 Clock Propagation Analysis Determines that there is no Asynchronous Clock-Domain Crossing

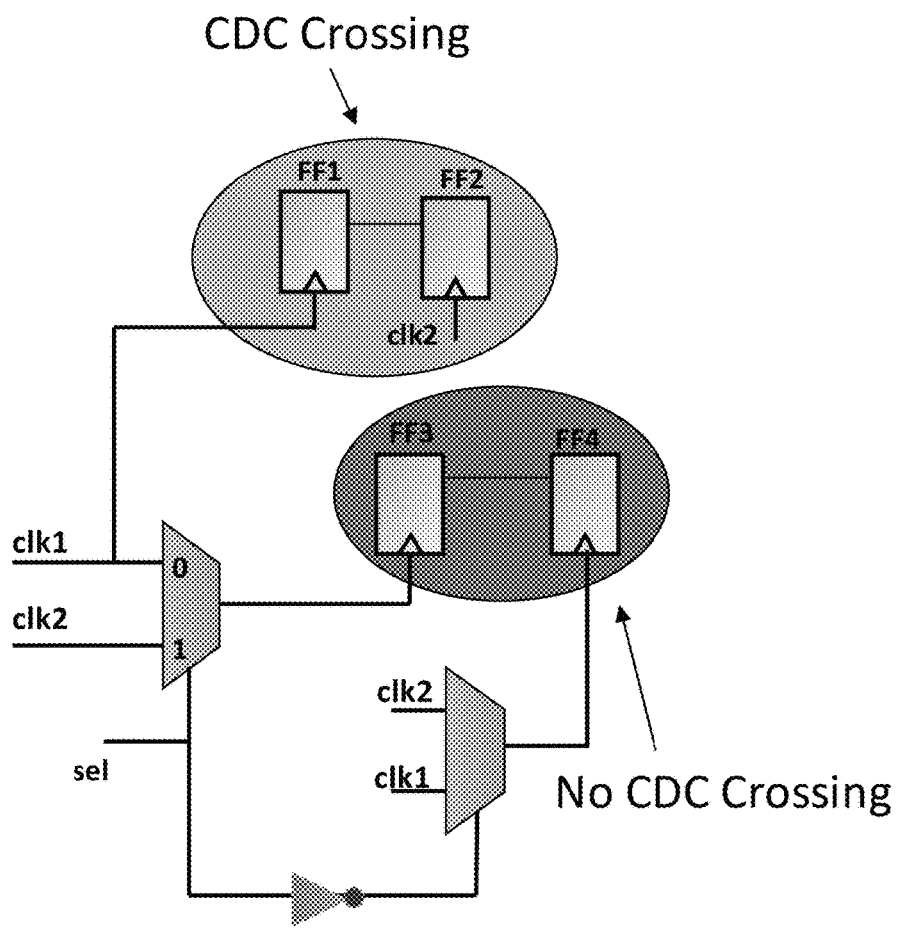
Fig. 5 Clock Propagation Analysis Determines where there is an Asynchronous Crossing

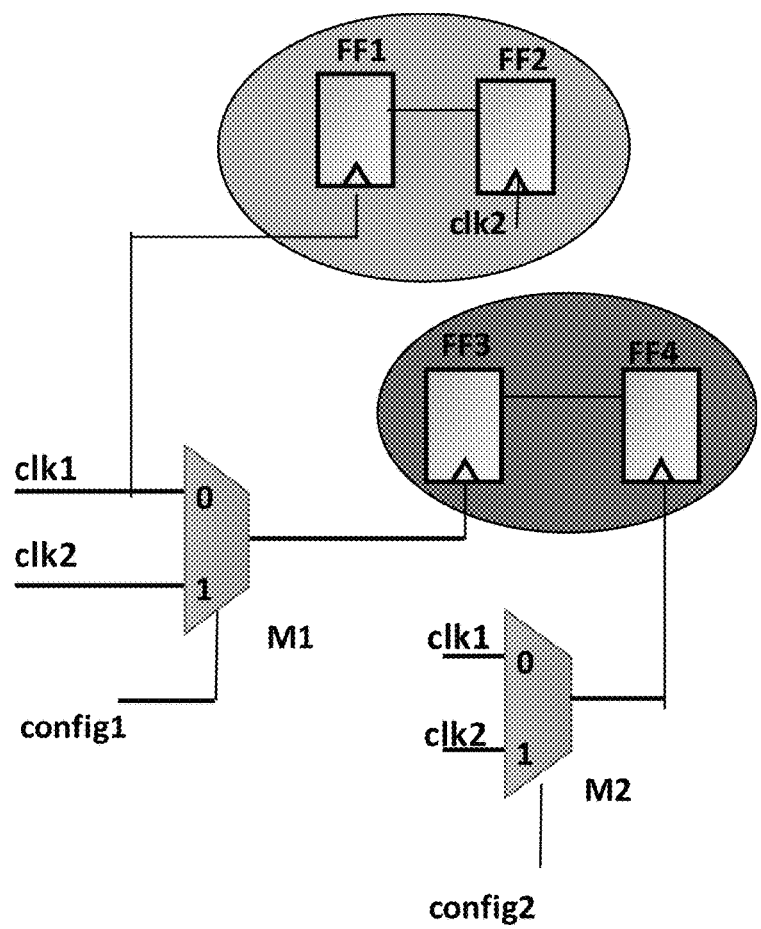
Fig. 6 Asynchronous Crossing from FF3 to FF4 Depends on Relationship of config1 to config2

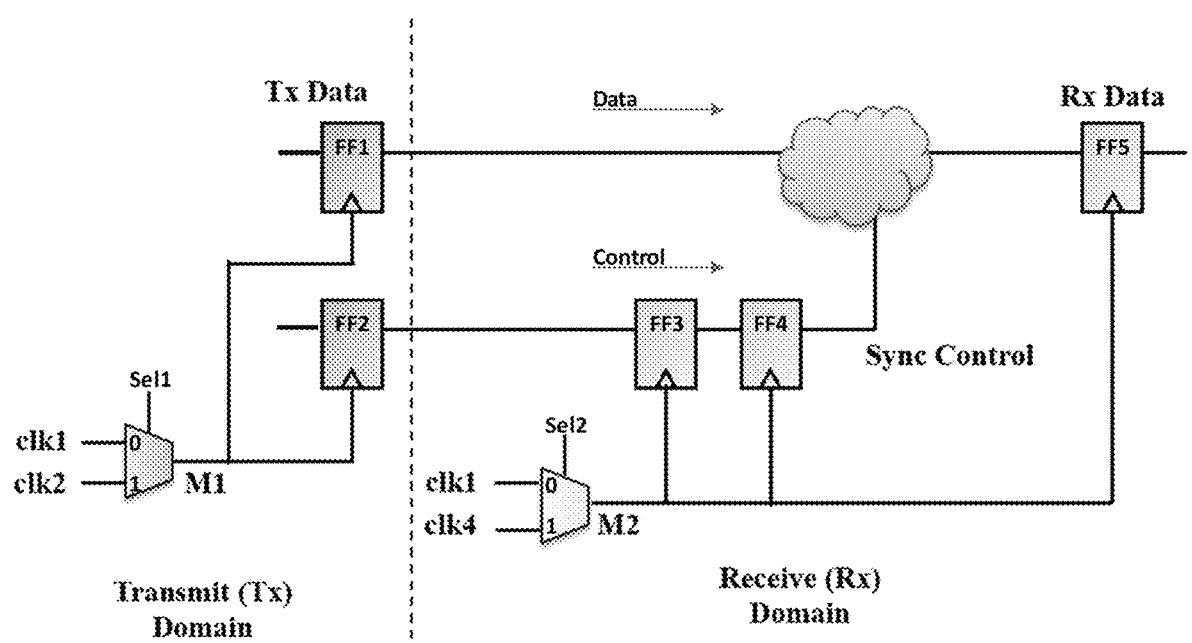
Fig. 7 Asynchronous Clock-Domain Crossing with Control, Data and Multiple Modes

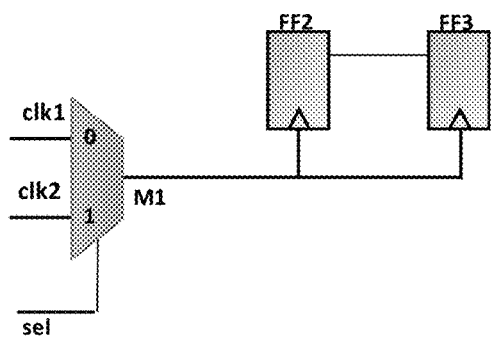
Fig. 8 Back-to-Back Flip-Flops that are a Synchronizer in all Modes

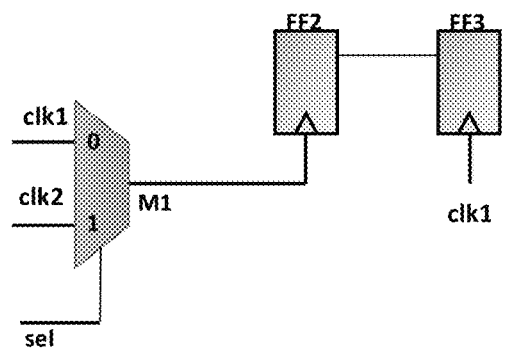
Fig. 9 Back-to-Back Flip-Flops that are a Synchronizer in Only Some Modes

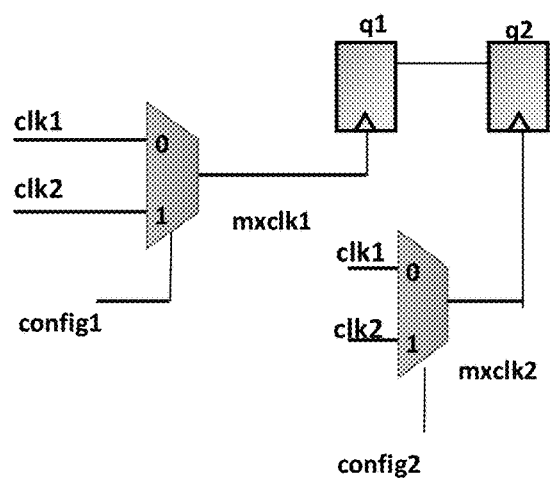
Fig. 10 Flip-Flops q1-q2 Being a Synchronizer Depends on Relationship From config1 to config2

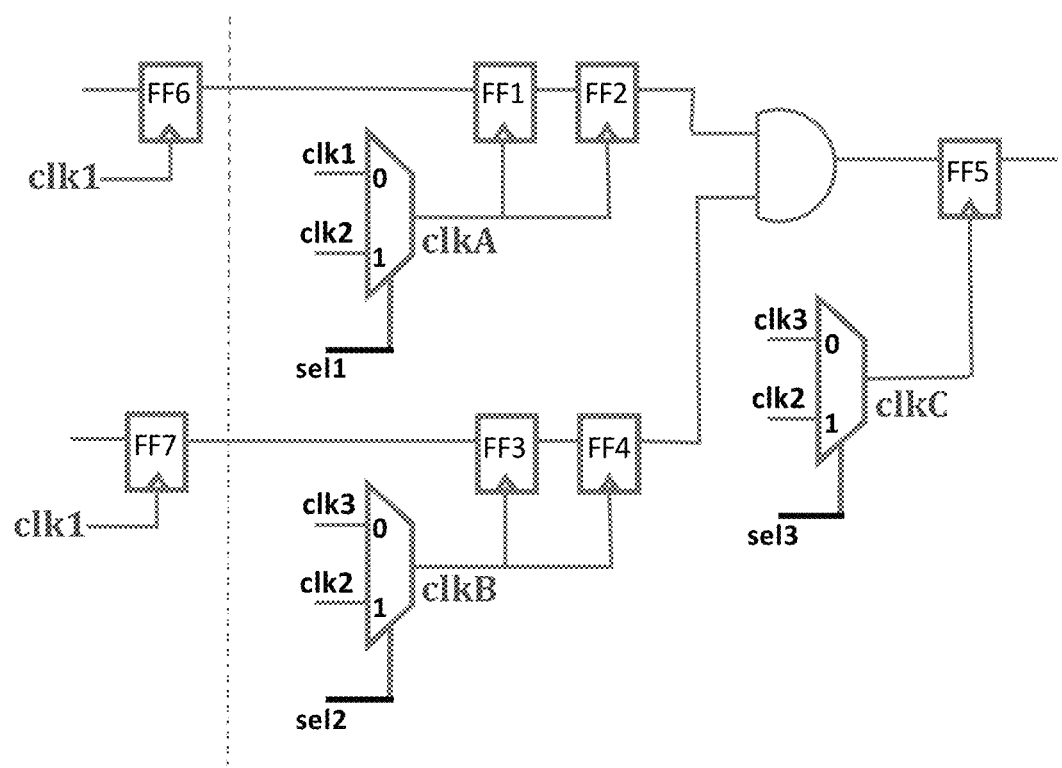
Fig. 11 Example of Asynchronous Reconvergent Control-Synchronizer Structure

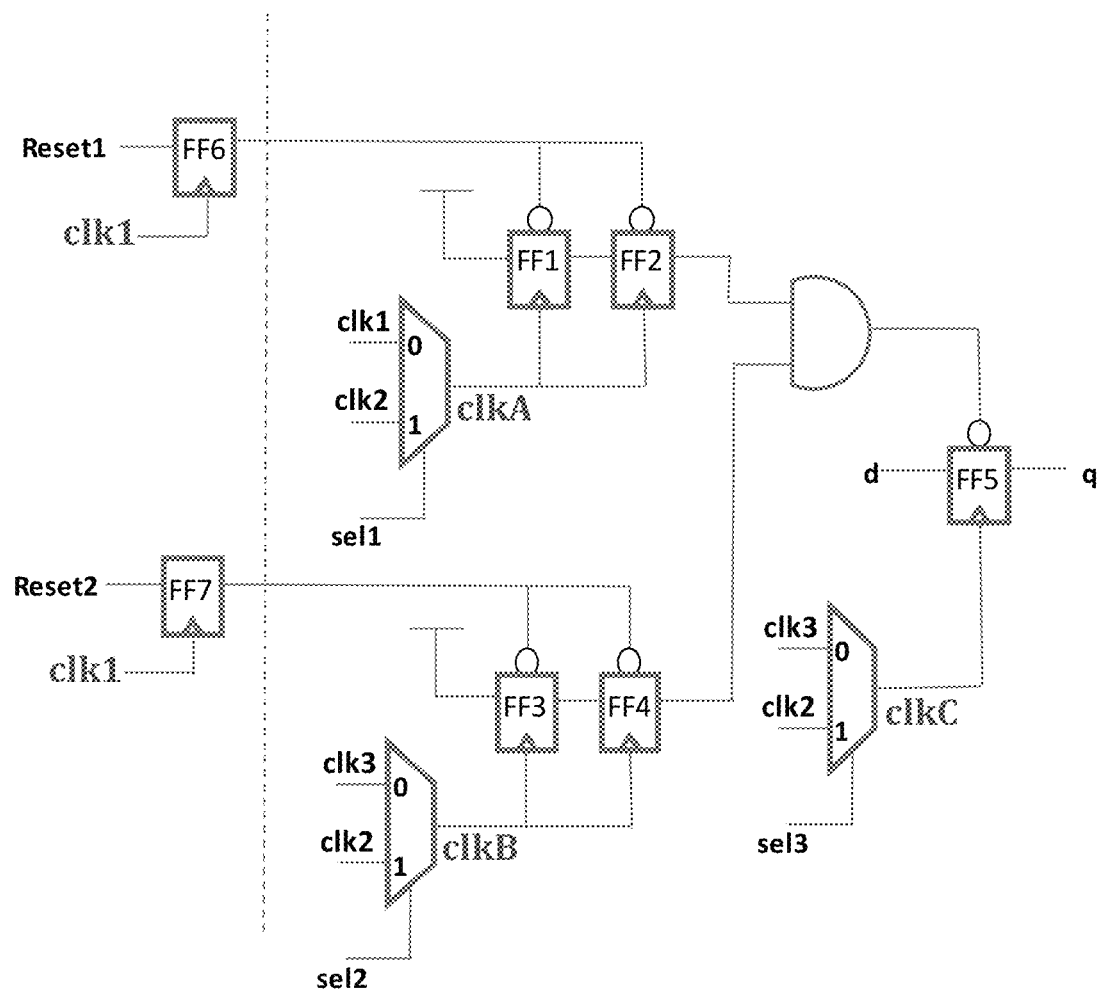
Fig. 12 Example of Asynchronous Reconvergent Reset-Synchronizer Structure

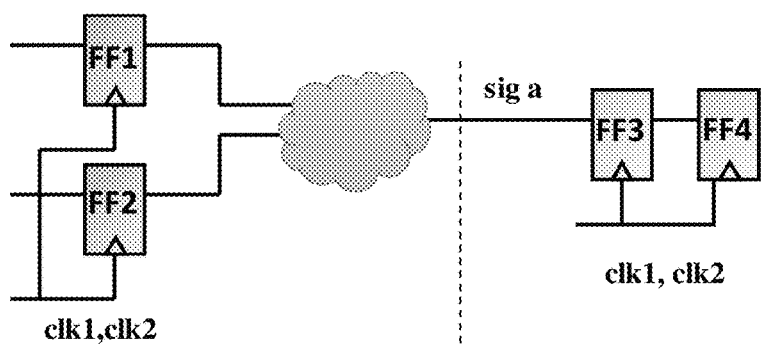
Fig. 13 Glitch Failure Reporting Depends on Clocks at the Input and Output of Combinational Logic

METHODS FOR IDENTIFYING INTEGRATED CIRCUIT FAILURES CAUSED BY ASYNCHRONOUS CLOCK-DOMAIN CROSSINGS IN THE PRESENCE OF MULTIPLE MODES

FIELD OF INVENTION

An integrated circuit is comprised of interconnected logic gates and storage elements. Said storage elements could be flip-flops, latches or various types of memory. In a synchronous design paradigm, which is a design paradigm of choice for almost all integrated circuits, said storage elements are controlled by a clock such that said clock determines the time when the value stored in each storage element is updated.

A "clock domain" is a collection of said storage elements such that all of said storage elements in said collection are controlled by either the same clock phase or by deterministically correlated clock phases. It is typically the case that an integrated circuit has many clocks, and, thereby, many said clock domains. Some of said clocks could be relatively asynchronous, which means that there is no preset correlation between the time of occurrence of transitions between said relatively asynchronous clocks. An interface between clock domains, said interface being implemented as a logic circuit connecting said clock domains, such that said interfacing clock domains are controlled by said relatively asynchronous clocks is termed an asynchronous clock-domain crossing. In certain rare cases when the clock domains are relatively synchronous, but STA is not performed for an interface between said clock domains, said interface is effectively an asynchronous clock domain crossing and analyzed as such. Without loss of generality, said rare case will not be emphasized in the present application. It should be noted that the methods recited in the present invention also apply to said rare case.

An asynchronous clock-domain crossing comprises of logic paths, said paths comprising of a sequence of interconnected logic gates such that at least some of the sources and all the destinations of said paths are, respectively, in asynchronous clock-domains, said logical paths being termed asynchronous. A storage element has specific requirements on the arrival times of its input signal relative to the arrival times of transitions on its controlling clock. Said requirements are imposed in order to ensure uncorrupted transfer of signal value into said storage element. Said requirements are not possible to satisfy when said path is asynchronous. Therefore, in order to ensure uncorrupted transfer of signals across an asynchronous clock-domain crossing comprising said asynchronous paths, said crossing must implement a protocol that overcomes said inability to impose said arrival time requirements. The lack of use of said protocol in an asynchronous clock-domain crossing, or an incorrect implementation of said protocol, are liable to cause integrated circuit failure. Said potential for failure is very difficult to identify by performing logic simulation or static-timing-analysis on an integrated circuit.

Engineers must follow the above basic design principles in an implementation of said asynchronous clock-domain crossings. Debilitating failures, which make the manufactured integrated circuit defective, are caused when said design principles are not followed. Verification techniques are required that aid in ensuring a robust asynchronous clock-domain crossing design that is free of failures caused by corrupted transfer of signals across said asynchronous clock-domain crossing.

Specialized verification-software tools are used to determine said failure potential in the presence of said asynchronous clock-domain crossings. Said verification tools are mostly static in their analysis approach, said term "static" being a general term intended to mean that said verification tools perform analysis of the integrated circuit without recourse to logic simulation.

Almost all System On Chip (SOC) integrated circuits have more than one operating mode, each said operating mode determining the specific operation of an integrated circuit, including a choice of which one of said many clocks propagates to each storage element. Further, an integrated circuit applies clock-gating, as required, to stop or enable propagation of a clock to storage elements connected to it. As a consequence of using said operating modes and said clock-gating, propagation of clocks in an integrated circuit, and, thereby, a determination of a clock domain to which a storage element belongs, changes dynamically, i.e., changes with time over a course of operation of said integrated circuit. As a further consequence, said asynchronous clock-domain crossings present in an integrated circuit also change with time over a course of operation of said integrated circuit.

Almost all SOC integrated circuits also have many configurable subcomponents, contributing to significant overall functional complexity and a large number of operating modes. Accompanying the abundance of said subcomponents and operating modes, there is also a proliferation of internal and external protocols, and aggressive power requirements. The net result is that the number of asynchronous clocks, and interacting combinations thereof, is extremely large in almost all SOC integrated circuits. Ensuring that such an integrated circuit works according to functional specification, i.e., without failure, in all operating modes, despite the variety of asynchronous clock-domain interactions possible, is an extremely challenging problem. Verification techniques are required that ensure robust asynchronous clock-domain crossing design that is free of asynchronous-crossing related failures across all of the large number of possible operating modes in order to ensure failure-free manufactured integrated circuits.

Identifying potential failures caused by asynchronous clock-domain crossings for all clock-domain combinations associated with the various operating modes of an integrated circuit has hitherto been impossible in practice. The present invention addresses this issue by providing very efficient methods by the use of which potential asynchronous clock-domain related failures across all operating modes are detected prior to the manufacture of an integrated circuit. In particular, the present invention applies static analysis methods, the term "static analysis" being well known in the art as applying to methods that do not rely on simulation, on a model of an integrated circuit design, said model consisting of interconnected logic elements, latches, flip-flops and memories, in order to determine a potential for said failures. By doing so, the present invention enables the manufacture of defect-free manufactured integrated circuits.

The static analysis methods in the present invention are designed to be comprehensive and precise, i.e., they are designed to find all asynchronous clock-domain crossings in an integrated circuit when said crossings violate design-principles that would avoid asynchronous clock-domain crossing related failures in a manufactured integrated circuit. Without this invention, multiple man-months would get spent in investigating defective manufactured integrated circuits, when said defect is caused by an asynchronous clock-domain related design violation.

BACKGROUND OF INVENTION

Poor design of asynchronous clock-domain crossings can result in unreliable functional behavior, causing intermittent catastrophic failures in a manufactured integrated circuit (the "chip"). The potential for said catastrophic failures is not caught reliably by other static-analysis methods like Static Timing Analysis (STA), or through logic simulation. Said failures are often first observed during commercial or safety-critical operation of an integrated circuit, causing substantial harm. Said failures are also known to be difficult to diagnose and expensive to fix.

The potential for integrated circuit failure due to asynchronous clock-domain crossings is further exacerbated by the presence of multiple operating modes and clock-propagation conditions, both of which do vary with time and integrated circuit configuration, said multiple operating modes and clock propagation conditions causing the aggregate number of asynchronous clock-domain crossings to become impractically large.

The present invention addresses the analysis complexity of detecting failures in asynchronous clock-domain crossings as a result of said large number of operating modes and clock-propagation conditions.

A representative storage element in an integrated circuit is an edge-triggered flip-flop. A basic edge-triggered flip-flop has data ("d"), clock ("clk") and reset ("reset") as inputs, and one output ("q"). A typical flip-flop is sensitive to either the 0-to-1 clock edge or the 1-to-0 clock edge, but not to both, said edge to which the flip-flop is sensitive being termed the relevant edge. A flip-flop circuit is designed so that, when the "reset" input is active, the value stored in said flop-flop and its "q" output are set to said flip-flop's reset value. When a flip-flop's "reset" input is inactive, said flip-flop's "q" output is set to the value stored in said flip-flop, said stored value being determined as said flip-flop's "d" input value just prior to the said relevant transition edge of "clk". In order for a "d" value to be captured without corruption, it must remain steady at the desired value a preset amount of time before and after said relevant clock-edge, said amount of time before and after the said relevant clock-edge being termed the "setup-and-hold window". It is therefore also the case that a "q" value can change only on the arrival of said relevant clock edge.

A "d" value is determined as the output of a logic circuit (also termed a "logic cone") consisting of a multiplicity of interconnected logic gates, said logic cone having a multiplicity of inputs, each of said inputs being either an output of a storage element in said integrated circuit or an input to said integrated circuit. Consequently, a change in a value, i.e., a value transition, on each of said inputs is controlled by a clock specifically associated with that input.

Two clocks are deemed relatively synchronous when the time interval between any edge on one clock and an edge of the other clock is predetermined. Conversely, when said interval cannot be determined a priori, said two clocks are deemed relatively asynchronous. When the clock controlling a flip-flop at an output of said logic cone is relatively synchronous to all clocks of all said inputs to said logic cone, said logic cone is deemed a synchronous clock-domain crossing. Conversely, when the clock controlling a flip-flop at an output of said logic cone is relatively asynchronous to a clock of any one of said inputs to said logic cone, said logic cone is deemed an asynchronous clock-domain crossing. For said synchronous clock-domain crossing, it is possible using Static Timing Analysis (STA) to determine whether said "d" input value will remain steady in said setup-hold window. Therefore, it is possible using STA to determine whether a "d" value will be stored without corruption in said flip-flop. In an asynchronous clock-domain crossing, on the other hand, it is not possible to determine with certainty that said "d" input value will remain steady in said setup-hold window.

When the "d" input of a flip-flop changes in said setup-hold window, the "q" output of said flip-flop becomes metastable, said metastable state being defined as a condition in which said "q" output is at a voltage in between voltages corresponding to logic-0 and logic-1, and from which state said "q" output will randomly settle to either a value 0 or a value 1 in a probabilistically determined amount of time. Effectively, said "d" input value is corrupted when it is stored into said flip-flop.

Since said "d" input of a flip-flop at a receiving end of an asynchronous clock-domain crossing cannot be guaranteed to be steady in said setup-hold window, it is possible for said flip-flop to enter said metastable state, and for a stored value in said flip-flop to be different from said "d" input value intended to be stored in said flip-flop, in other words, for said flip-flop's stored value, and consequently said flip-flop's "q" output, to be corrupted.

Consider the circuit shown in FIG. 1 as a representative example of an asynchronous clock-domain crossing. Conventional symbols are used for the logic-gate elements in said figure. The rectangles in said figure are intended to represent edge-triggered flip-flops. The flip-flops to the left of the dashed vertical line are controlled by CLK1, thereby being in clock-domain CLK1. The flip-flops to the right of said dashed vertical line are controlled by CLK2, thereby being in clock-domain CLK2. Consider that CLK1 and CLK2 are relatively asynchronous to each other, i.e., that the logic cone driving the flip-flop labelled "R" is an asynchronous clock-domain crossing. The CLK1 domain is termed the "Transmit domain" or "Tx domain", and the CLK2 domain is termed the "Receive domain" or "Rx domain". The flip-flops in the Tx domain are correspondingly termed "Tx flip-flops", and the flip-flops in the Rx domain are termed "Rx flip-flops". It is desired to send a data signal from the Tx flip-flop labelled "T" to said Rx flip-flop "R" without corruption. Since CLK1 and CLK2 are relatively asynchronous, said flip-flop "R" could become metastable upon receiving a value change from said flip-flop "T", i.e., uncorrupted transfer of data from "T" to "R" cannot be guaranteed.

Additional measures are required in order to ensure uncorrupted data transfer in an asynchronous clock-domain crossing. Said additional measures must ensure that as long as transmitted data (the output of Tx flip-flop "T" in FIG. 1) is not yet stable, either it is blocked from reaching the receiving Rx flip-flop (flip-flop "R" in FIG. 1) or that the output of the receiving Rx flip-flop (flip-flop "R" in FIG. 1) is blocked from being seen by logic in the Rx domain downstream from said receiving flip-flop. Said additional measures are termed "Basic Design Principles" in the present application. As a representative example, FIG. 1 shows said approach of blocking said unsteady transmitted data from reaching said receiving flip-flop "R". Said approach (in effect an asynchronous interface protocol) is shown implemented in FIG. 1 as the boxes labelled "Control" and "Feedback". Said type of asynchronous interface protocol shown in FIG. 1 is called a "Load-Control protocol". It is also possible to ensure adherence to said design principles using other protocols like the "Propagation-Control protocol" and the "FIFO-Control protocol" that are well known to practitioners of the art and not described in the present application.

The pair of Rx flip-flops "B" and "C" in said figure ensure that said metastability is limited to said flip-flop "B" and to the wire connecting the output of flip-flop "B" and the input of flip-flop "C", i.e., flip-flop "C" does not become metastable. Said pair of flip-flops is called a "synchronizer". In some embodiments, said synchronizer could comprise of more than two flip-flops in sequence. Said synchronizer's role is to "synchronize" an incoming signal to a receiving clock domain, i.e., to ensure that, as seen by logic downstream to said synchronizer, a synchronizer's output changes only on a clock edge of a receiving clock domain. A synchronizer consisting of a pair of Rx flip-flops, such as "B" and "C" in said figure, ensure that the output flip-flop of the pair, such as "C" in said figure, only changes on a specific edge of an Rx-domain clock, such as a 0-to-1 edge of the Rx-domain clock CLK2 in said figure. The pair of TX flip-flops "G" and "F" in said figure is also a synchronizer, said synchronizer ensuring that the output of flip-flop "G" can only change on a 0-to-1 edge of the Tx-domain clock CLK1 in said figure. The signal "3" in said figure ensures that the Rx flip-flop "R", which is intended to be the recipient of the transmitted data, only sees incoming data signal after said data is stable.

It is not required to describe the detailed operation of said Control and Feedback logic-circuits in FIG. 1 for the purpose of the present invention, except to state that a verification software tool intending to certify correct operation of asynchronous clock-domain crossings in an integrated circuit must analyze said logic circuits to check that said design principles are being followed for every single asynchronous clock-domain crossing in said integrated circuit. Said analysis must first identify where asynchronous clock-domain crossings are present in an integrated circuit, following which, said analysis must identify control signals being transmitted through synchronizers across a clock-domain boundary in forward and feedback directions, and associated data signals that are to be transmitted without corruption across said clock-domain boundary.

Performing said analysis to identify and check the very large number of asynchronous clock-domain crossings in a large integrated circuit is complex and onerous for even a single operating mode. When said analysis is repeated over the typically large number of operating modes in an integrated circuit, said analysis becomes impractical to complete.

In summary, efficient and quality diagnosis of asynchronous clock-domain crossing failures is very important for the manufacture of defect-free integrated circuits. The analysis complexity is rendered onerous to the point of being impractical by the presence of a large number of operating modes and clock-propagation conditions, but no prior art presents methods specifically to alleviate said complexity or the lack of precision in diagnosing asynchronous clock-domain crossing failures in the presence of said complexity. The present invention specifically addresses this limitation by reciting methods to reduce said complexity and to enhance the quality of diagnosis for asynchronous clock-domain crossing failures in the presence of a large number of operating modes and clock-propagation conditions.

SUMMARY OF INVENTION

The present invention in its various embodiments enables a software tool or computer system that efficiently and accurately diagnoses the potential for failures in an integrated circuit, said failures being related to asynchronous clock-domain crossings. In particular, the present invention is focused on the accurate and efficient detection of asynchronous clock-domain crossing failures in the presence of a large number of operating modes and clock-propagation conditions in an integrated circuit. To that end, methods unanticipated in prior art are recited in the present invention that automatically extract potential asynchronous clock-domain crossings in an integrated circuit to precisely determine operating modes and clock-propagation conditions under which said crossings could have failures.

A typical embodiment of this invention receives as input (1) a model of a design to be implemented as an integrated circuit, said model comprising of gates or other various logical elements, and flip-flops or other memory elements, connected by wires, and (2) waveform and connectivity information about clock signals, reset signals and other inputs, including, if available, operating-mode signals, to said integrated circuit, said information being referred to as an "Environment Spec" in the present application. The output of said typical embodiment is a detailed report of a potential for asynchronous clock-domain crossing failures in said integrated circuit as encapsulated by said model, said report allowing a person to take corrective measures, prior to the manufacture of said integrated circuit, to prevent design flaws that cause said asynchronous clock-domain crossing failures.

In particular, said methods overcome the disadvantages of prior art by not requiring an explicit enumeration and analysis of all of said operating modes and clock-propagation conditions in order to determine said failures or to ensure absence of said failures. Said overcoming of disadvantages of prior art enables said methods to be practical for integrated circuits even with a very large number of said operating modes and clock-propagation conditions. Said methods are described in detail in the following section.

DESCRIPTION OF THE FIGURES

FIG. 1: A Representative Asynchronous Clock-Domain Crossing

FIG. 2: Input-Output Flow for Operating-Mode-Aware Asynchronous CDC Analysis FIG. 3: Example of How Modes Cause or Prevent Asynchronous Clock-Domain Crossings FIG. 4: Clock Propagation Analysis Determines that there is no Asynchronous Clock-Domain Crossing FIG. 5: Clock Propagation Analysis Determines where there is an Asynchronous Crossing FIG. 6: Asynchronous Crossing from FF3 to FF4 Depends on Relationship of config1 to config2

FIG. 7: Asynchronous Clock-Domain Crossing with Control, Data and Multiple Modes FIG. 8: Back-to-Back Flip-Flops that are a Synchronizer in all Modes FIG. 9: Back-to-Back Flip-Flops that are a Synchronizer in Only Some Modes FIG. 10: Flip-Flops q1-q2 Being a Synchronizer Depends on Relationship From config1 to config2

FIG. 11: Example of Asynchronous Reconvergent Control-Synchronizer Structure FIG. 12: Example of Asynchronous Reconvergent Reset-Synchronizer Structure FIG. 13: Glitch Failure Reporting Depends on Clocks at the Input and Output of Combinational Logic

DETAILED DESCRIPTION OF THE INVENTION

A description of the present invention, including the various methods and systems therein and some embodiments thereof, is provided in this section in sufficient detail that a person skilled in the art would be able to reproduce them. The description herein is also sufficiently general to enable skilled practitioners to realize straightforward variations and derivations. As such, this description must be interpreted in the widest scope possible.

As described previously in this application, the present invention, in its various embodiments, seeks to provide a software tool or computer system to enable an efficient and accurate determination of a potential for integrated circuit failure caused by asynchronous clock-domain crossings in the presence of multiple operating modes, and in conjunction, to determine design errors responsible for said potential failures.

An illustrative embodiment is as shown in FIG. 2 wherein the methods and systems suggested in the present invention receive a design model of an integrated circuit and an Environment Specification, said Environment Specification comprising of relevant contextual information such as signal names and waveforms for clocks, resets, constraints and operating modes etc., as input. Said methods and systems perform static analysis, said static analysis referring to analysis performed prior to and without recourse to simulation of a large number of input stimuli, to determine potential asynchronous clock-domain crossings in said integrated circuit, followed by a mode-aware analysis for flawed implementation of said crossings to determine potential for integrated circuit failure. As example, said Environment Specification comprises information indicating whether a pair of clocks is to be considered as relatively asynchronous in an integrated circuit. As another example, said Environment Specification also comprises information indicating whether a pair of clocks is to be considered as mutually exclusive in an integrated circuit, said mutual exclusivity implying that said clocks will not be active simultaneously in said integrated circuit. Said flawed crossings are reported to a designer of said integrated circuit in order that said flaws can be corrected prior to a fabrication of said integrated circuit.

Precise characterization of modal effects on failure potential due to asynchronous clock-domain crossings: Various methods are recited herein for the purpose of determining the effects of modes and clock-propagation logic in an integrated circuit, said effects collectively termed "modal effects" in the present application, on the potential for integrated circuit failure caused by asynchronous clock-domain crossings. Efficiency is achieved in said methods by means of an approach of analyzing modal effects in the context of potential asynchronous clock-domain crossings, or in the context of potential failures in said potential asynchronous clock-domain crossings, said contexts being collectively termed "async crossings and effects" for the purpose of this application. Said approach, termed "targeted modal-effect analysis" in the present application, is fundamentally superior in the following ways compared to the naïve approach in prior art of enumerating all modes up front and analyzing an integrated circuit for said modal effects separately for each said enumerated mode:

1. The number of operating modes is very large in most System On Chip (SOC) integrated circuits, and SOC integrated circuits are complex enough that analysis of asynchronous-crossings for even one operating mode is time-consuming. A complete analysis of an entire integrated circuit separately for each mode is, hence, extremely time consuming or even intractable. By analyzing for modal effects in the context of individual potential asynchronous crossings, the methods recited in the present invention substantially localize the logical circuits that must be considered for analysis. Said localization enables an analysis of modal effects for all modes in an acceptably short and practical amount of time even for complex integrated circuits. Said enablement is a significant advance over prior art because said enablement allows for comprehensive analysis of an integrated circuit for all asynchronous crossings and associated effects across all operating modes and clock-propagation conditions, thereby minimizing the likelihood of integrated circuit failure caused by asynchronous clock-domain crossings.

2. With said local analysis of modal effects in a specific context of an individual asynchronous clock-domain crossing, the number of operating modes with distinct modal effects in said local context is much reduced compared to the total number of operating modes in an entire chip. The total number of combinations to be considered over an entire integrated circuit, is, therefore, much smaller when said combinations are considered locally for each asynchronous clock-domain crossing as recited in the present invention, compared to the prior art of considering all asynchronous clock-domain crossings for each operating mode at the top level of an integrated circuit.

3. It is often the case that a design-implementation error leads to an asynchronous clock-domain crossing failure in more than one operating mode. The analysis of modal effects in the context of asynchronous crossings and associated effects enables methods recited in the present invention to report said implementation error only once, consolidated across said more than one operating modes, even if it manifests as an asynchronous clock-domain crossing failure in said more than one operating modes. Since the eventual goal of reporting said failures is to realize an integrated circuit free of said failures, said consolidated reporting of implementation errors enabled by methods recited in the present invention allows said eventual goal of realizing a failure-free integrated circuit more efficiently than with prior art.

Method for Targeted Mode-Effect Analysis to Determine Asynchronous Clock-Domain Crossings: A first step in the determination of asynchronous clock-domain crossing failures is the determination of "flip-flop to flip-flop" paths such that the driving and receiving flip-flops are controlled by clocks that are relatively asynchronous. In said paths, said driving flip-flop may instead be a primary input associated with a clock-domain. Similarly, said receiving flip-flop may instead be a primary output associated with a clock-domain. For the ease of exposition, and without loss of generality, said paths are assumed to be "flip-flop to flip-flop" paths in the present application. When there is no clock selection involved for driving and receiving flip-flops of a path in an integrated circuit, i.e., when both flip-flops are connected to clocks directly without any intervening clock selection or clock propagation logic, said path can be determined to be in an asynchronous clock-domain crossing directly based on whether said clocks have been declared as being relatively asynchronous in an Environment Specification. When one or both of said flip-flops in said path are such that multiple clocks converge through clock selection logic at clock input pins of said flip-flops, or when one or more clocks are routed through clock propagation logic to said clock input pins, logical analysis is performed on clock pins of said flop-flops to determine whether there is a logical condition, comprising of logical values on wires in said integrated circuit, for which the clock pin of said driving flip-flop is dependent on a clock that is relatively asynchronous to the clock to which the clock-pin of the said receiving flip-flop is simultaneously dependent. If such a logical condition is determined to exist, said path is deemed to be an asynchronous clock-domain crossing. Said paths for which logical analysis is required in order to determine whether said path is asynchronous are termed "potentially asynchronous" paths in the present application. The methods recited in the present invention enumerate all potentially asynchronous paths in an integrated circuit, and, for each of said potentially asynchronous paths, perform said logical analysis to determine whether said path is truly an asynchronous clock-domain crossing. If said path is determined to be truly an asynchronous clock-domain crossing, said methods further determine all logical conditions under which said path is an asynchronous clock-domain crossing, and, for each said logical condition, said methods determine the clock propagating to said driving flip-flop and the clock-propagating to said receiving flip-flop.

A circuit example is shown in FIG. 3 to illustrate how modes can cause or prevent asynchronous clock-domain crossings. FF1 and FF2 are flip-flops with a simple path connecting them. FF1 is the driving flip-flop and FF2 is the receiving flip-flop. Only one clock (clk2) is connected to FF2, but three clocks (clk1, clk2 and clk3) converge to the clock input of FF1 through two multiplexors M1 and M2. The select input of multiplexor M1 is sel1, and the select input of multiplexor M2 is sel2. The "operating modes" of this circuit fragment are the four combinations of the sel1 and sel2 signals. The choice of operating mode determines which clock propagates to and controls FF1. To be noted in the FIG. 3 example is that even though there are four operating modes possible, only three distinct clocks can propagate to FF1. The operating modes corresponding to 10 and 00 values both propagate clk3 to FF1. This observation is illustrative of the fact that in practical integrated circuits, the total number of operating modes is larger, typically much larger, than the number of clock combinations that propagate to flip-flops in a local scope of an individual clock-domain crossing. A second observation to be noted in said example is that the FF1-to-FF2 path is an asynchronous crossing for operating modes 00, 01 and 11 since the three stated operating modes propagate either clk1 or clk3 to FF1, which are both defined as being asynchronous to the FF2 clock clk2. The FF1-to-FF2 path is not an asynchronous crossing for operating mode 10 since both FF1 and FF2 are controlled by clk2 in that mode. Said second observation is illustrative of a need to perform local mode analysis to determine whether a path in a local scope within an integrated circuit is indeed an asynchronous clock-domain crossing.

Analysis for a determination of operating modes for which a local-scope path is an asynchronous clock-domain crossing, as well as for an enumeration of said operating modes and clocks propagating to flip-flops in said paths for each of said operating modes, can be performed efficiently using Boolean operations. Specifically, a Boolean Difference operation is performed on clock selection and propagation logic for driving and receiving flip-flops of a potentially asynchronous path under consideration (for example the FF1-to-FF2 path in FIG. 3) in terms of a support-set including variables representing input clocks, operating-mode signals (sel1 and sel2 in FIG. 3) and any other signals contributing to clock selection and propagation. A Boolean Difference operation is well known to practitioners of logic computation and logic-circuit design. The output of a Boolean Difference operation on a logic function, with respect to a subset of said logic function's input variables, is the set of all combinations of those of said logic function's input variables that are not part of said subset, such that for each of said combinations said logic function depends on said subset of input variables. In said analysis, said subset of input variables consists of variables corresponding to clocks potentially propagating to flip-flops in said potentially asynchronous path. The variables not in said subset are the said mode-signals and any other signals input into said clock selection and propagation logic. A Boolean Difference operation can be performed very efficiently using data structures such as Binary Decision Diagrams commonly used in logic computation. From the output of said Boolean Difference operation, it is straightforwardly determined if there is any operating mode condition for which driving and receiving flip-flops in a potentially asynchronous path are controlled simultaneously by clocks that are active together and are relatively asynchronous. All such clock combinations causing said path to be an asynchronous clock-domain crossing, along with operating mode conditions for which said clocks propagate, are easily extracted from the output of said Boolean Difference operation. In this manner, local analysis of operating mode effects, and whether a potentially asynchronous path is truly an asynchronous clock-domain crossing, can be performed very efficiently.

For further understanding, additional examples of cases that require analysis of clock-selection and clock-propagation are shown in FIGS. 4, 5 and 6. In the circuit in FIG. 4, said analysis determines that for all values of the sel signal, in other words for all operating modes of said circuit, the active source flip-flop (one of either FF1 or FF2) has the same clock as the destination flip-flop (FF3). In effect, the end result is that said circuit does not have an asynchronous clock domain crossing, said result being determined by means of local modal analysis.

FIG. 5 shows an example circuit in which some crossings are asynchronous crossings whereas others are not. Clocks clk1 and clk2 relatively asynchronous in said circuit. The path from flip-flop FF1 to flip-flop FF2 is clearly an asynchronous clock domain crossing since FF1 is always controlled by clk1 and FF2 by clk2. In said figure, clock-selection and clock-propagation analysis determines that the path from flip-flop FF3 to flip-flop FF4 is never an asynchronous clock domain crossing since the clock at the two flip-flops is always the same, irrespective of the value on the clock selection signal sel.

FIG. 6 shows an example circuit with two asynchronous clocks clk1 and clk2. The path from flip-flop FF1 to flip-flop FF2 is an asynchronous clock domain crossing since FF1 is always controlled by clk1 and FF2 by clk2. The path from flip-flop FF3 to flip-flop FF4, on the other hand, may or may not be asynchronous depending on the relationship between operating mode signals config1 and config2, said relationship being determined by logic driving said config1 and config2 signals, or being determined by constraints provided for said config1 and config2 signals in an Environment Spec. Clock-selection and clock-propagation analysis must be performed to determine whether the path from FF3 to FF4 is an asynchronous clock domain crossing.

The aforementioned examples also illustrate that whereas an SOC integrated circuit may have a large number of operating modes and operating mode signals, local determination of whether a path represents an asynchronous clock domain crossing is generally based on a small number of operating mode signals and a small number of clock-propagation cases.

A preferred embodiment of the present method comprises the following steps:
1. Perform propagation of clocks and additional contextual information like constants to the maximum extent possible into an integrated circuit design.
2. Perform path tracing in said integrated circuit design to determine potentially asynchronous paths.
3. For each potentially asynchronous path identified in step 2,
   a. Determine clocks potentially propagating to said path's driving flip-flop, and clock-selection and clock-propagation variables associated with said clocks. Determine clock-selection and clock-propagation logic associated with said clocks to said driving flip-flop.
   b. Determine clocks potentially propagating to said path's receiving flip-flop and clock-selection and clock-propagation variables associated with said clocks. Determine clock-selection and clock-propagation logic associated with said clocks to said receiving flip-flop.
   c. Perform analysis on said clock-selection and clock-propagation logic determined in steps 3a and 3b, for example using a Boolean Difference operation, to determine whether said driving and receiving flip-flops are controlled by simultaneously active clocks that are relatively asynchronous to each other.
   d. Determine all operating mode conditions for which the answer to said analysis in step 3c is in the affirmative.
   e. If the answer to said analysis in step 3c is in the affirmative, tag said path under analysis as being truly an asynchronous clock-domain crossing, and thereby as being required to be further analyzed for asynchronous clock-domain crossing effects and failures.

Whereas the above embodiment is detailed enough for implementation and reproduction by practitioners of the art, it is also a general approach based on which a skilled practitioner would be able to derive variations to achieve the same goal of efficiently identifying truly asynchronous clock-domain crossings in presence of a large number of operating modes in an integrated circuit. As such, the above embodiment must be interpreted in the widest scope possible.

Methods for Targeted Modal-Effect Analysis to Determine Implementation Structures Associated with Asynchronous Clock-Domain Crossings: A well-constructed asynchronous clock-domain crossing has a clearly defined control path and a clearly defined data path, said data and control paths being designed so that said control path ensures that a signal transmitted along said data path is received uncorrupted and without generation of metastability at a flip-flop in a receiving clock domain. A typical asynchronous clock-domain crossing with control and data paths is shown in FIG. 7. Said control path is characterized by the presence of an implementation structure called synchronizer, said synchronizer typically consisting of two or more back-to-back flip-flops controlled by a receiving clock domain. In the circuit of FIG. 7, sel1 and sel2 are the operating mode signals. The clocks in said circuit, namely clk1, clk2 and clk4, are defined as being relatively asynchronous to each other. When an operating mode is chosen such that said sel1 and sel2 are 0 and 1, respectively, the transmitting clock is clk1 and the receiving clock is clk4, and the FF1-to-FF5 path and the FF2-to-FF3 path are truly asynchronous clock-domain crossing paths. FF3 and FF4 are back-to-back flip-flops in the receiving domain, and together form a synchronizer structure, termed "synchronizer" in the present application. An asynchronous clock-domain crossing path with a synchronizer on the receiving side is a control path intended to provide a signal synchronized to a receiving clock-domain, said synchronized signal being used to ensure uncorrupted transmission of data. An asynchronous clock-domain data crossing path with an accompanying asynchronous clock-domain control crossing path, as shown in FIG. 7, is considered structurally sound. When an accompanying asynchronous clock-domain control crossing path is absent, an asynchronous clock-domain data crossing path is reported as an error.

Control-synchronizer: Whether or not said accompanying asynchronous clock-domain control crossing path is present depends on a presence of a synchronizer in said path. For back-to-back flip-flops to constitute a synchronizer, said back-to-back flip-flops must be controlled by an identical clock. As a result, whether or not back-to-back flip-flops constitute a synchronizer depends on clock-propagation and modal effects. Consider the circuit fragment shown in FIG. 8. FF2 and FF3 in FIG. 8 are back-to-back flip-flops and can be a synchronizer for both values, 0 or 1, of the operating mode signal sel. In FIG. 9, on the other hand, FF2 and FF3 are controlled by the same clock (clk1) when the operating mode signal sel is 0, but are controlled by different clocks (FF1 controlled by clk2 and FF2 controlled by clk1) when the operating mode signal sel is 1. For the circuit fragment in FIG. 9, therefore, FF2 and FF3 can be a synchronizer when the operating mode signal sel is 0, but not when the operating mode signal sel is 1. Effectively, FF2 and FF3 being a synchronizer is mode dependent. As with the detection of asynchronous clock-domain crossings, the detection of asynchronous clock-domain crossing implementation structures like synchronizers is impractical if said detection is attempted separately for each operating mode. The present invention recites very efficient methods based on which potential said implementation structures are detected initially in an analysis of an integrated circuit design without the application of operating mode signals. The determination of whether said potential implementation structures are truly asynchronous clock-domain crossing implementation structures is subsequently determined in a local scope.

FIG. 10 shows an example circuit with two clocks clk1 and clk2. Whether the pair of flip-flops q1 and q2 is a synchronizer depends on the relationship between operating mode signals config1 and config2, said relationship being determined by logic driving said config1 and config2 signals, or being determined by constraints provided for said config1 and config2 signals in an Environment Spec. q1 and q2 must be controlled by the same clock for the pair to be a synchronizer. Clock-selection and clock-propagation analysis must be performed to determine whether said condition is satisfied.

Control reconvergence: Another asynchronous clock-domain implementation structure of relevance in failure analysis of asynchronous clock-domain crossings is a reconvergence of synchronized signals. An illustrative example of such a structure is shown in FIG. 11. Consider that the clocks clkA, clkB and clkC are the outputs of clock-selection or clock-propagation logic, said selection or propagation being determined by a choice of operating mode signals. FF1 and FF2 are back-to-back flip-flops controlled by clkA. FF3 and FF4 are back-to-back flip-flops controlled by clkB. The two pairs of said back-to-back flip-flops converge through logical paths at the input to flop-flop FF5, said FF5 being controlled by clock clkC. Said convergence is deemed a reconvergent asynchronous clock-domain crossing structure likely to cause integrated circuit failure, and reported as such, when it satisfies the requirement that clkA, clkB and clkC are the same clock and relatively asynchronous to clk1. The satisfaction of said requirement can be determined only by analyzing modal effects pertaining to a selection and propagation of clocks to clkA, clkB and clkC. As in the analysis of modal effects stated previously in the present application, said determination of whether a path convergence, such as shown in FIG. 11, is a reconvergent asynchronous clock-domain crossing structure is inefficient and impractical if it is performed after each mode has been explicitly applied. Methods recited in the present invention alleviate said inefficiency by first determining potential asynchronous clock-domain crossing structures in a mode-independent manner, and subsequently performing local analysis of clock-selection and clock-propagation logic to determine whether said structure is truly an asynchronous clock-domain crossing reconvergent structure. By means of said method, it is possible to determine said reconvergent structures very efficiently.

Reset-synchronizer: Similar to a use of synchronizers to synchronize control signals to ensure uncorrupted transmission of data signals across an asynchronous clock-domain crossing, said synchronizers being termed "control-synchronizers", said use being previously stated in the present application, back-to-back flip-flops are also used as synchronizers to synchronize a reset signal to a clock domain of a flip-flop to which said reset signal is applied, said synchronizers on reset paths being termed "reset-synchronizers". Whether back-to-back flip-flops constitute a reset-synchronizer is determined by modal effect dependent clock selection and clock propagation. As in the detection of control-synchronizer structures in the presence of modal effects, as stated previously in the present application, the detection of reset-synchronizer structures in the presence of modal effects is also much more efficient and practical when potential reset-synchronizers are first identified in a mode-independent manner, followed by local analysis of mode-dependent clock-selection and clock-propagation logic to determine whether said potential reset-synchronizers are truly reset synchronizers.

Reset-synchronizer reconvergence: Similar to control-synchronizers, the convergence of reset-synchronizers along logical paths prior to their use is also a cause of integrated circuit failure. The detection of asynchronous reconvergent reset-synchronizer structures must satisfy the same requirements as previously stated in the present application for detecting asynchronous reconvergent control-synchronizer structures. As in the case of control-synchronizers, the detection of reconvergent reset-synchronizer structures is also more efficient and practical when potential said reconvergent reset-synchronizer structures are identified first in a mode-independent manner, followed by local modal effect analysis to determine whether said potential structures are truly reconvergent reset-synchronizer structures.

An illustrative example of circuit fragment with potentially reconverging reset synchronizers is shown in FIG. 12. Consider that the clocks clkA, clkB and clkC are the outputs of clock-selection or clock-propagation logic, said selection or propagation being determined by choice of operating mode signals. FF1 and FF2 are back-to-back flip-flops controlled by clkA. FF3 and FF4 are back-to-back flip-flops controlled by clkB. Said pair FF1 and FF2 constitutes a reset synchronizer that synchronizes the reset signal Reset1 in said figure to clock domain clkA. Similarly, said pair FF3 and FF4 constitutes a reset synchronizer that synchronizes reset signal Reset2 in said figure to clock domain clkB. The two pairs of said back-to-back flip-flops converge through logical paths at the reset input to flop-flop FF5, FF5 being controlled by clock clkC. Said convergence is deemed a reconvergent asynchronous clock-domain crossing structure likely to cause integrated circuit failure, and reported as such, when it satisfies the requirement that clkA, clkB and clkC are the same clock and relatively asynchronous to clk1. The satisfaction of said requirement can be determined only by analyzing the modal effects pertaining to the selection and propagation of clocks to clkA, clkB and clkC. As in the analysis of modal effects stated previously in the present invention, said determination of whether a path convergence, such as shown in FIG. 12, is a reconvergent asynchronous clock-domain crossing structure is inefficient and impractical if it is performed after each operating mode has been explicitly applied. Methods recited in the present invention alleviate said inefficiency by first determining potential asynchronous clock-domain crossing structures in a mode-independent manner, and subsequently performing local analysis of clock-selection and clock-propagation logic to determine whether said structure is truly an asynchronous clock-domain crossing reconvergent structure. By means of said method, it is possible to determine said reconvergent structures very efficiently.

Clock-Domain Crossing Glitch: A glitch on an asynchronous clock domain crossing path is a hazard, said hazard being caused by logic gates being present on said path. Whether a path is reported as a glitch hazard depends on clocks that control flip-flops at the start and end of said path. In an integrated circuit with multiple operating modes and clock-selection logic, said clocks are determined by analyzing clock-selection logic and clock-propagation logic. For example, in the circuit in FIG. 13, clk1 and clk2 in the circuit being asynchronous to each other, signal "sig a" is reported as having a glitch a hazard if flip-flops FF1 and FF2 are controlled by clk1 and flip-flop FF3 by clk2, or if flip-flops FF1 and FF2 are controlled by clk2 and flip-flop FF3 by clk1. No glitch hazard is reported when FF1, FF2 and FF3 are controlled by the same clock. In effect, glitch hazard reporting is controlled by operating mode analysis.

A number of structures have been presented above whose detection is relevant in a failure analysis of asynchronous clock-domain crossings in an integrated circuit. A general method is presented herein with sufficient detail that a practitioner of the art can implement said method to efficiently identify said structures, and variations thereof. A preferred embodiment of the present method comprises the following steps:

1. Perform propagation of clocks and additional contextual information like constants to a maximum extent possible into an integrated circuit design.
2. Determine potential and truly asynchronous clock-domain crossings including consideration of modal effects and clock-propagation effects based on methods previously recited in the present application.
3. Perform path tracing in said integrated circuit design to determine potential asynchronous clock-domain crossing control-synchronizer or reset-synchronizer implementation structures, and the fanout flip-flop at which outputs of said synchronizer structures converge.
4. For each potential asynchronous clock-domain crossing synchronizer implementation structure and said fanout flip-flop identified in step 3, a. Determine clocks potentially propagating to said synchronizer and fanout flip-fops, and clock-selection and clock-propagation variables associated with said clocks. Determine clock-selection and clock-propagation logic associated with said clocks propagating to said flip-flops.

b. Perform analysis on said clock-selection and clock-propagation logic determined in step 4a, for example using a Boolean Difference operation, to determine whether said flip-flops are controlled by simultaneously active clocks that are the same and are asynchronous to a clock in a transmitting clock domain as required for said potential reconverging synchronizer structure to be a true asynchronous clock-domain crossing reconverging synchronizer structure.

c. Determine all mode conditions for which the answer to said analysis in step 4b is in the affirmative.

d. If the answer to said analysis in step 4b is in the affirmative, tag said potential implementation structure as being truly an asynchronous clock-domain crossing reconverging synchronizer structure, and thereby to be considered as such in further analysis of a asynchronous clock-domain crossing in which it is present.

Whereas the above embodiment is detailed enough for implementation and reproduction by practitioners of the art, it is also a general approach based on which a skilled practitioner would be able to derive variations to achieve the same goal of efficiently identifying truly asynchronous clock-domain crossing reconverging synchronizer structures, such as the examples disclosed in the present invention or variations thereof, in the presence of a large number of operating modes in an integrated circuit. As such, the above embodiment must be interpreted in the widest scope possible.

What is claimed is:

1. A method for asynchronous clock-domain crossing verification of an integrated circuit design, said verification being performed for the purpose of ensuring error-free operation of a fabricated digital integrated circuit, said integrated circuit design comprising of more than one operating mode, said method comprising:

performing propagation of contextual information comprising signals and waveforms for clocks, resets and constants into said integrated circuit design;

performing path tracing in said integrated circuit design to determine potentially asynchronous paths, said paths being characterized by the start and end points of said paths potentially being in relatively asynchronous clock domains;

for each said potentially asynchronous path, performing further analysis steps comprising:

determining clocks potentially propagating to said path's driving flip-flop, determining clock-selection and clock-propagation variables associated with said clocks, and determining clock-selection and clock-propagation logic associated with said clocks to said driving flip-flop;

determining clocks potentially propagating to said path's receiving flip-flop, determining clock-selection and clock-propagation variables associated with said clocks, and determining clock-selection and clock-propagation logic associated with said clocks to said receiving flip-flop;

performing analysis of said clock-selection and clock-propagation logic to determine whether said driving and said receiving flip-flops are controlled by simultaneously active clocks that are relatively asynchronous to each other;

determining all operating mode conditions for which said driving and said receiving flip-flops are controlled by simultaneously active clocks that are relatively asynchronous to each other;

if one or more of said operating mode conditions are determined to exist, tagging said path under analysis as being truly an asynchronous clock-domain crossing, and, thereby, as being required to be further analyzed for asynchronous clock-domain crossing effects and failures.

2. The method of claim 1 in which said analysis of clock-selection and clock-propagation logic to determine whether said driving and said receiving flip-flops are controlled by simultaneously active clocks that are relatively asynchronous to each other is performed using a Boolean Difference operation.

3. The method of claim 1 in which further analysis is performed to determine if path determined to be an asynchronous clock domain crossing has a glitch hazard, and determining specific operating mode conditions under which said glitch hazard is present.

4. The method of claim 1 in which further analysis is performed to detect control synchronizers in an integrated circuit design, said integrated circuit design possessing multiple operating modes, said control synchronizers being defined as a chain of flip-flops such that the first flip-flop in said chain is a receiving flip-flop in an asynchronous clock-domain crossing path and the remaining flip-flops in said chain are controlled by the same clock as said first flip-flop, said method comprising:

performing propagation of contextual information comprising signals and waveforms for clocks, resets and constants into said integrated circuit design;

performing path tracing in said integrated circuit design to determine potential control synchronizers;

for each said potential control synchronizer, performing further analysis steps comprising:

determining clocks potentially propagating to said potential control-synchronizer's flip-flops, determining clock-selection and clock-propagation variables associated with said clocks, and determining clock-selection and clock-propagation logic associated with said clocks to said flip-flops;

performing analysis of said clock-selection and clock-propagation logic to determine whether said flip-flops are such that said first flip-flop in said control-synchronizer is a receiving flip-flop in an asynchronous clock-domain crossing path and all flip-flops in said control synchronizer are controlled by the same simultaneously active clocks;

determining all operating mode conditions for which said first flip-flop is a receiving flip-flop in an asynchronous clock-domain crossing path and all said flip-flops are controlled by the same simultaneously active clocks;

if one or more of said operating mode conditions are determined to exist, tagging said path under analysis as being truly a control synchronizer, and further tagging the output of the final flip-flop in said control synchronizer as being a control signal in an asynchronous clock-domain crossing.

5. The method of claim 4 in which said analysis of clock-selection and clock-propagation logic to determine whether said potential control synchronizer is truly a control synchronizer is performed using a Boolean Difference operation.

6. Method of claim 4 in which further analysis is performed to detect whether the outputs of multiple said control synchronizers, said synchronizers being controlled by the same clock, converge through logical paths on to a single wire prior to being captured in a destination flip-flop, said destination flip-flop also being controlled by the same clock as said control synchronizers, said convergence being termed "control synchronizer reconvergence", in an integrated circuit design, said integrated circuit design possessing multiple operating modes, said method comprising:
  performing propagation of contextual information comprising signals and waveforms for clocks, resets and constants into said integrated circuit design;
  performing path tracing in said integrated circuit design to determine potential control synchronizer reconvergence;
  for each said potential control synchronizer reconvergence, performing further analysis steps comprising:
  determining clocks potentially propagating to synchronizer flip-flops in said potential control synchronizer reconvergence, determining clocks potentially propagating to said destination flip-flops in said potential control synchronizer reconvergence, and further determining clock-selection and clock-propagation variables associated with said clocks, and determining clock-selection and clock-propagation logic associated with said clocks;
  performing analysis of said clock-selection and clock-propagation logic to determine whether, in some operating mode, said clocks controlling said control synchronizers and said destination flip-flop are the same simultaneously active clocks;
  determining all operating mode conditions for which said clocks controlling said control synchronizers and said destination flip-flop are the same simultaneously active clocks;
  if one or more of said operating mode conditions are determined to exist, tagging said potential control synchronizer reconvergence as being truly a control synchronizer reconvergence.

7. The method of claim 6 in which said analysis of clock-selection and clock-propagation logic to determine whether said potential control synchronizer reconvergence is truly a control synchronizer reconvergence is performed using a Boolean Difference operation.

8. The method of claim 1 in which further analysis is performed to detect reset synchronizers in an integrated circuit design, said integrated circuit design possessing multiple operating modes, said reset synchronizers being defined as a chain of flip-flops in the path of a reset signal such that the first flip-flop in said chain is controlled by a clock that is relatively asynchronous to the clock associated with the incoming reset signal, and the remaining flip-flops in said chain are controlled by the same clock as said first flip-flop, and further that the clock controlling said flip-flops is the same as the clock controlling the flip-flop whose reset input is connected to the final flip-flop in said reset synchronizer, said method comprising:
  performing propagation of contextual information comprising signals and waveforms for clocks, resets and constants into said integrated circuit design;
  performing path tracing in said integrated circuit design to determine potential reset synchronizers;
  for each said potential reset synchronizer, performing further analysis steps comprising:
  determining clocks potentially propagating to said potential reset-synchronizer's flip-flops and all flip-flops whose reset inputs are connected to the output of said final flip-flop in said potential reset synchronizer, determining clock-selection and clock-propagation variables associated with said clocks, and determining clock-selection and clock-propagation logic associated with said clocks to said flip-flops;
  performing analysis of said clock-selection and clock-propagation logic to determine whether said flip-flops are such that said first flip-flop in said reset-synchronizer is controlled by a clock that is relatively asynchronous to said incoming reset signal, and all flip-flops in said reset-synchronizer are controlled by the same simultaneously active clocks, and further that said same clocks are also the same as the clock controlling all flip-flops whose reset inputs are connected to the output of said final flip-flop in said potential reset synchronizer;
  determining all operating mode conditions for which said first flip-flop is controlled by a clock that is relatively asynchronous to the incoming reset signal, and all flip-flops in said reset-synchronizer are controlled by the same simultaneously active clocks, and further that said same clocks are also the same as the clock controlling all flip-flops whose reset inputs are connected to the output of said final flip-flop in said potential reset synchronizer;
  if one or more of said operating mode conditions are determined to exist, tagging said path under analysis as being truly a reset synchronizer.

9. The method of claim 8 in which said analysis of clock-selection and clock-propagation logic to determine whether said potential reset synchronizer is truly a reset synchronizer is performed using the Boolean Difference operation.

10. The method of claim 8 in which further analysis is performed to detect whether the outputs of multiple said reset synchronizers, said synchronizers being controlled by the same clock, converge through logical paths on to a single wire prior to being used as a reset signal in a destination flip-flop, said destination flip-flop also being controlled by the same clock as said reset synchronizers, said convergence being termed "reset synchronizer reconvergence", in an integrated circuit design, said integrated circuit design possessing multiple operating modes, said method comprising:
  performing propagation of contextual information comprising signals and waveforms for clocks, resets and constants into said integrated circuit design;
  performing path tracing in said integrated circuit design to determine potential reset synchronizer reconvergence;
  for each said potential reset synchronizer reconvergence, performing further analysis steps comprising:
  determining clocks potentially propagating to synchronizer flip-flops in said potential reset synchronizer reconvergence, determining clocks potentially propagating to said destination flip-flops in said potential reset synchronizer reconvergence, and further determining clock-selection and clock-propagation variables associated with said clocks, and determining clock-selection and clock-propagation logic associated with said clocks;
  performing analysis of said clock-selection and clock-propagation logic to determine whether, in some operating mode, said clocks controlling said reset synchronizers and said destination flip-flop are the same simultaneously active clocks;

determining all operating mode conditions for which said clocks controlling said reset synchronizers and said destination flip-flop are the same simultaneously active clocks;

if one or more of said operating mode conditions are determined to exist, tagging said potential reset synchronizer reconvergence as being truly a reset synchronizer reconvergence.

11. The method of claim 10 in which said analysis of clock selection and propagation logic to determine whether said potential reset synchronizer reconvergence is truly a reset synchronizer reconvergence is performed using a Boolean Difference operation.

12. The methods as in any one of claims 6, 7, 10 and 11, in which the reconvergence being checked is between a reset synchronizer and a control synchronizer.

\* \* \* \* \*